US010885679B2

(12) United States Patent
Blackledge et al.

(10) Patent No.: US 10,885,679 B2
(45) Date of Patent: Jan. 5, 2021

(54) METHOD FOR PRODUCING A WEIGHTED MAGNETIC RESONANCE IMAGE

(71) Applicants: The Institute of Cancer Research: Royal Cancer Hospital, London (GB); Royal Marsden NHS Foundation Trust, Sutton (GB)

(72) Inventors: Matthew Blackledge, Sutton (GB); David Collins, Sutton (GB); Martin Leach, Sutton (GB)

(73) Assignees: The Institute of Cancer Research: Royal Cancer Hospital, London (GB); Royal Marsden NHS Foundation Trust, Sutton (GB)

( * ) Notice: Subject to any disclaimer, the term of this patent is extended or adjusted under 35 U.S.C. 154(b) by 0 days.

(21) Appl. No.: 16/092,431

(22) PCT Filed: Mar. 28, 2017

(86) PCT No.: PCT/EP2017/057305
§ 371 (c)(1),
(2) Date: Oct. 9, 2018

(87) PCT Pub. No.: WO2017/178227
PCT Pub. Date: Oct. 19, 2017

(65) Prior Publication Data
US 2020/0234472 A1    Jul. 23, 2020

(30) Foreign Application Priority Data
Apr. 11, 2016  (GB) .................................. 1606108.7

(51) Int. Cl.
*G06K 9/00*  (2006.01)
*G06T 11/00*  (2006.01)
(Continued)

(52) U.S. Cl.
CPC ........ *G06T 11/008* (2013.01); *G01R 33/4835* (2013.01); *G01R 33/5608* (2013.01);
(Continued)

(58) Field of Classification Search
None
See application file for complete search history.

(56) References Cited

U.S. PATENT DOCUMENTS 6,163,152 A      12/2000  Bernstein et al.
7,701,210 B2      4/2010  Ichinose
8,754,645 B2 *    6/2014  Gross .................. G01R 33/565
                                                324/309

FOREIGN PATENT DOCUMENTS

EP          0965855 A2    12/1999
WO      20101161214 A1    10/2010

OTHER PUBLICATIONS

Gratidis et al., "Apparent diffusion coefficient-dependent voxelwise computed diffusion-weighted imaging: an approach for improving SNR and reducing T2 shine-through effects", Sep. 2015 (Year: 2015).*

(Continued)

*Primary Examiner* — Soo Jin Park
(74) *Attorney, Agent, or Firm* — Rudy J. Ng; Bozicevic, Field & Francis LLP

(57) ABSTRACT

A method of producing a magnetic resonance (MR) image of a region of interest is provided. The method includes the steps of: acquiring an initial MR image of the region of interest, the initial MR image mapping values of an MR-sensitive, physical property at positions over the region; determining a corresponding map of the estimated uncertainties in the values of the MR-sensitive, physical property over the region; and calculating a weighted MR image of the region, the weighted MR image mapping values of a function which combines, at each position of the initial image, (Continued)

the respective value of the MR-sensitive, physical property and the respective estimated uncertainty, the function applying a higher weighting to positions with relatively low estimated uncertainties than to positions with relatively high estimated uncertainties.

13 Claims, 8 Drawing Sheets

(51) Int. Cl.
G01R 33/483 (2006.01)
G01R 33/56 (2006.01)
G01R 33/563 (2006.01)
G06T 7/00 (2017.01)

(52) U.S. Cl.
CPC ...... *G01R 33/56341* (2013.01); *G06T 7/0012* (2013.01); *G06T 2207/10088* (2013.01); *G06T 2207/30004* (2013.01)

(56) References Cited

OTHER PUBLICATIONS

Chung et al., "Comparison of bootstrap approaches for estimation of uncertainties of DTI parameters", 2006 (Year: 2006).*
Blackledge et al. (2011) Computed diffusion-weighted MR imaging may improve tumor detection. Radiology 261: 573-581.
Blackledge et al. (2014) Assessment of treatment response by total tumor volume and global apparent diffusion coefficient using diffusion-weighted MRI in patients with metastatic bone disease: a feasibility study. PLoS One 9: e91779.
Blackledge et al. (2016) Noise-corrected exponential DWI using multi-acquisition MRI facilitates quantitative evaluation of whole-body skeletal tumour burden in patients with metastatic prostate cancer. Proceedings of the Nternational Society for Magnetic Resonance in Medicine, 24nd Annual Meeting and Exhibition, Singapore, May 7-13, 2016, vol. 24, Apr. 23, 2016 (Apr. 23, 2016), p. 2422.
Coupé (2010) Robust Rician noise estimation for MR images. Med. Image Analysis 14(4): 483-493.
Eiber et al. (2011) Whole-body MRI including diffusion-weighted imaging (DWI) for patients with recurring prostate cancer: technical feasibility and assessment of lesion conspicuity in DWI. J Magn Reson Imaging 33: 1160-1170.
Gatidis et al. (2015) Apparent diffusion coefficient-dependent voxelwise computed diffusion-weighted imaging: An approach for improving SNR and reducing T shine-through effects. J Magn Reson Imaging.
Giles et al. (2014) Whole-body diffusion-weighted MR imaging for assessment of treatment response in myeloma. Radiology 271: 785-794.
Gudbjartsson and Patz (1995) The Rician distribution of noisy MRI data. Magn Reson Med 34: 910-914.
Koh and Collins (2007) Diffusion-weighted MRI in the body: applications and challenges in oncology. AJR Am J Roentgenol 188: 1622-1635.
Koh et al. (2012) Whole-body diffusion-weighted MRI: tips, tricks, and pitfalls. AJR Am J Roentgenol 199: 252-262.
Padhani et al. (2011) Whole-body diffusion-weighted MR imaging in cancer: current status and research directions. Radiology 261: 700-718.
Padhani et al. (2014) Therapy monitoring of skeletal metastases with whole-body diffusion MRI. J Magn Reson Imaging 39: 1049-1078.
Provenzale et al. (1999) Use of MR exponential diffusion-weighted images to eradicate T2 "shine-through" effect. AJR Am J Roentgenol 172: 537-539.
Van Ufford et al. (2011) Newly diagnosed lymphoma: initial results with whole-body T1-weighted, STIR, and diffusion-weighted MRI compared with 18F-FDG PET/CT. AJR Am J Roentgenol 196: 662-669.
Veraart et al (2013) Weighted linear least squares estimation of diffusion mri parameters: strengths, limitations, and pitfalls. Neuroimage, 81:335-46.

* cited by examiner

METHOD FOR PRODUCING A WEIGHTED MAGNETIC RESONANCE IMAGE

FIELD OF THE INVENTION

The present invention relates to magnetic resonance (MR) imaging methods and systems, and particularly to MR diffusion weighted imaging.

BACKGROUND

Whole-body diffusion-weighted MR-imaging (WBDWI) is becoming an attractive tool for staging and response evaluation of metastatic bone disease from a range of primary malignancies including: prostate [1, 2] breast [3], lymphoma [4] and myeloma [5]. WBDWI provides non-invasive contrast between diseased and healthy tissue, without the requirement of an exogenous contrast agent, providing clinicians with the ability to review the extent of metastatic disease throughout the skeleton in a single radiological view. By acquiring multiple images at the same anatomical locations with different diffusion weightings (b-values), WBDWI also offers measurement of the apparent diffusion coefficient (ADC), a biomarker that provides indirect quantification of tumour cellularity [6]. ADC quantification has shown great utility for evaluation of treatment response, where an increase in ADC following therapy is thought to indicate tumour necrosis [7].

A relatively recent adaption of WBDWI is computed DWI (cDWI) [8a, 8b]. This technique improves contrast between benign and diseased tissues by synthesizing images at b-values higher than those available from direct measurement. This can help to eliminate T2 shine-through effects, a common source of lesion misinterpretation, and improve the signal-to-noise ratio of high b-value images. This methodology has also been utilized for semi-automatic segmentation of disease in WBDWI studies, providing quantification of whole-body volumetric tumour burden (tDV) and global lesion ADC (gADC), both of which may be used as biomarkers for assessing treatment response [9]. cDWI relies upon the use of a b=0 image ($S_0$), either acquired or estimated from model fitting, that is used alongside ADC measurements to synthetically generate high b-value images. $S_0$ images are affected by T1, T2 and proton density of the imaged tissue, such that the resulting contrast in cDWI may not necessarily be attributed to differences in ADC between tissues. Furthermore, $S_0$ images are typically heavily influenced by coil sensitivity, leading to severe signal inhomogeneities across the field of view; this is typically manifested as a "signal-step" artefact between acquisition stations [1]. Such image inhomogeneities hinder standardisation of segmentation techniques in WBDWI due to differences in absolute signal intensity within and between institutions. Others have attempted to provide a solution to these difficulties via exponentially weighted DW-imaging (eDWI) [10]. This methodology sets $S_0$ to a constant value across the entire field of view such that a synthetic high b-value image can be obtained with purely ADC generated contrast. However, this technique has inherently low contrast-to-noise ratio (CNR), as it is typically nave to areas where the ADC calculations are heavily influenced by imaging noise.

SUMMARY

The present invention aims to address shortcomings of the methods described above.

In general terms, the present invention proposes estimating uncertainties in values of an MR-sensitive, physical property, such as ADC, and using the estimated uncertainties to apply a weighting to e.g. produce a noise reduction in an MR image. Such an approach can be used, for example, to improve the observed CNR in eDWI images.

Accordingly, in a first aspect the present invention provides a method of producing a magnetic resonance (MR) image of a region of interest, the method including the steps of:

acquiring an initial MR image of the region of interest, the initial MR image mapping values of an MR-sensitive, physical property at positions over the region;

determining a corresponding map of the estimated uncertainties in the values of the MR-sensitive, physical property over the region; and calculating a weighted MR image of the region, the weighted MR image mapping values of a function which combines, at each position of the initial image, the respective value of the MR-sensitive, physical property and the respective estimated uncertainty, the function applying a higher weighting to positions with relatively low estimated uncertainties than to positions with relatively high estimated uncertainties.

As mentioned above, the weighted MR image may have improved CNR characteristics. In addition, the weighted MR image may be less susceptible to signal inhomogeneities, such as the signal inhomogeneities that can be observed in cDWI.

A second aspect of the invention provides a method of displaying 3D MR image data, the method including the steps of:

performing the method of the first aspect for each of a plurality of regions of interest which are respective parallel slices through a volume of interest, and thereby obtaining for each slice a corresponding weighted MR image; and displaying the weighted MR images as a projected volumetric image, e.g. as a maximum intensity projection of the volume of interest.

Advantageously, the method can improve visual comparison of projected volumetric images acquired for the same patient over multiple visits, and can thus be used to normalise segmentation of whole-body disease between institutions.

A third aspect of the invention provides a computer system operatively configured to perform the method of the first or second aspect. For example, a computer system for producing a weighted MR image of a region of interest may include:

computer readable medium for storing an initial MR image of the region of interest, the initial MR image mapping values of an MR-sensitive, physical property at positions over the region; and a processor or processors for determining a corresponding map of the estimated uncertainties in the values of the MR-sensitive, physical property over the region, and calculating a weighted MR image of the region, the weighted MR image mapping values of a function which combines, at each position of the initial image, the respective value of the MR-sensitive, physical property and the respective estimated uncertainty, the function applying a higher weighting to positions with relatively low estimated uncertainties than to positions with relatively high estimated uncertainties.

The computer system may include a display for displaying any one or more of the initial MR image, the map of the estimated uncertainties, the weighted MR image, and (if the system is operatively configured to perform the method of the second aspect) the projected volumetric image.

A further aspect of the invention provides a magnetic resonance imaging apparatus having a computer system of the third aspect.

Yet further aspects of the invention provide a computer program for performing the method of the first or second aspect, and a computer program product carrying a computer program for performing the method of the first or second aspect.

Optional features of the invention will now be set out. These are applicable singly or in any combination with any aspect of the invention.

The function may apply an inverse exponential weighting to the estimated uncertainties.

Conveniently, the estimated uncertainties may be determined from an inverse model of the values of the MR-sensitive, physical property over the region. For example, in the determination, the inverse model may be fitted to the values of the values of the MR-sensitive, physical property using a least-squares procedure.

The estimated uncertainties may be the variances of the values of the MR-sensitive, physical property.

The MR-sensitive, physical property may be apparent diffusion coefficient, T1, T2, or proton density. When the MR-sensitive, physical property is apparent diffusion coefficient, the function may apply a higher weighting to positions with relatively low apparent diffusion coefficient than to positions with relatively high apparent diffusion coefficient, e.g. the function may apply an inverse exponential weighting to the apparent diffusion coefficient. Thus the function can help to identify, in particular, areas of metastatic bone disease. Alternatively, when the MR-sensitive, physical property is apparent diffusion coefficient, the function may apply a lower weighting to positions with relatively low apparent diffusion coefficient than to positions with relatively high apparent diffusion coefficient, e.g. the function may apply an exponential weighting to the apparent diffusion coefficient. In this way the function can help to identify areas of necrosis. The initial MR image mapping values of apparent diffusion coefficient at positions over the region may be acquired by obtaining plural diffusion weighted images over the region at different b-values, and deriving the initial MR image therefrom.

BRIEF DESCRIPTION OF THE DRAWINGS

Embodiments of the invention will now be described by way of example with reference to the accompanying drawings in which.

Figure 1:
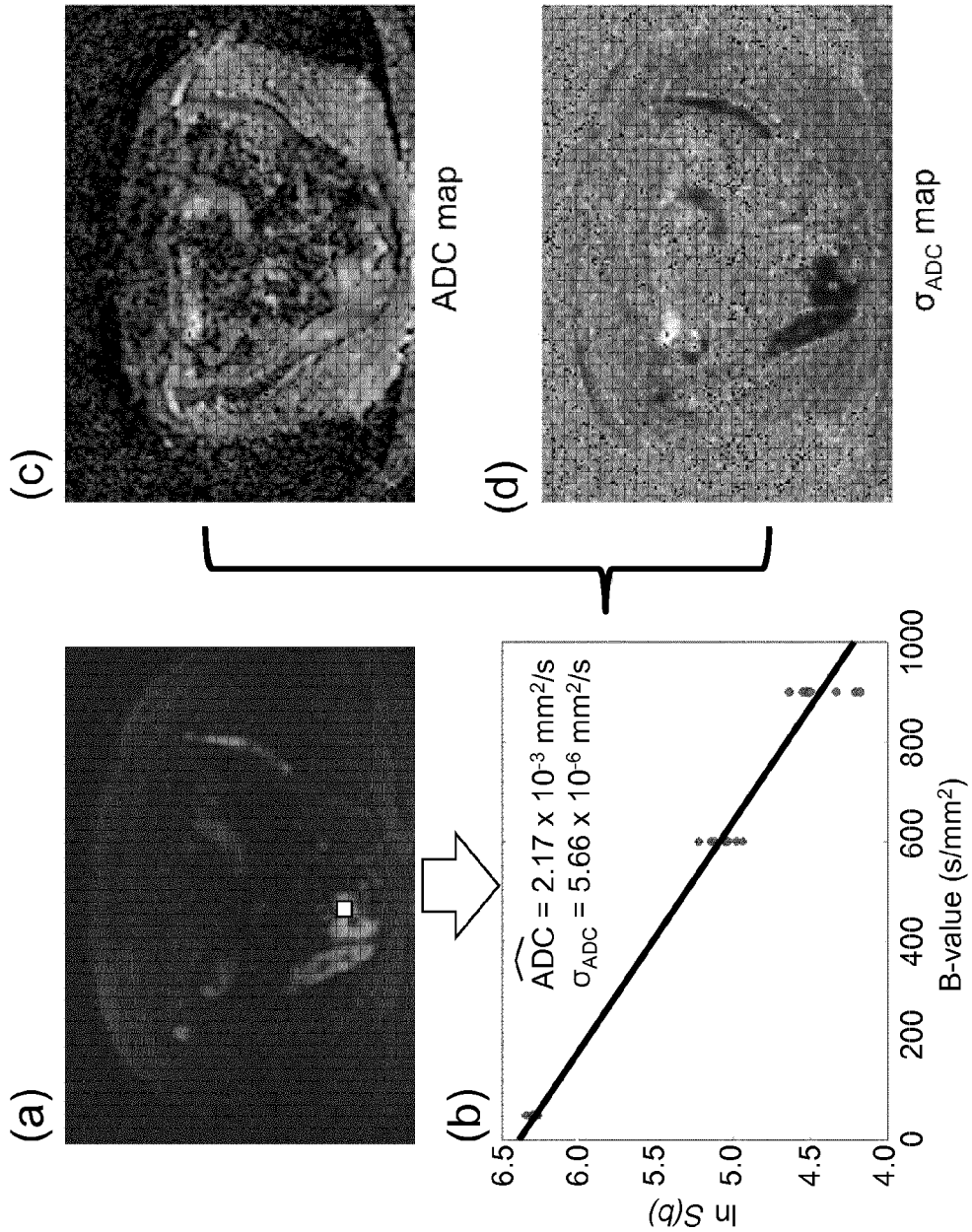
FIG. 1 shows: (a) a diffusion weighted MR image for a given cross-section and a given b-value; (b) a plot of lnS(b) against b-value for a plurality of such images, the values for lnS(b) in the plot being taken at the pixel indicated in (a), and calculated values for ADC and standard deviation $\sigma_{ADC}$ in ADC at that pixel; (c) an ADC image for the cross-section obtained by repeating the ADC calculation for other pixels; and (d) a $\sigma_{ADC}$ map for the cross-section obtained by repeating the $\sigma_{ADC}$ calculation for other pixels.

compared with approach (ii). Both approaches (ii) and (iii) improve the contrast between healthy and diseased tissues over approach (i).

DETAILED DESCRIPTION AND FURTHER OPTIONAL FEATURES

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention, it being understood that various changes may be made in the function and arrangement of elements without departing from the scope of the invention.

As disclosed herein, the term "computer readable medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Theory

A model for signal intensity, $S \in \mathfrak{R}^+$, in a magnetic resonance image may be given by:

$$S(\alpha,\beta)=m(\alpha|\beta)+\varepsilon$$

where $\alpha \in \mathfrak{R}^D$ denotes the MR-sensitive, physical properties of the tissue (e.g. ADC, spin-lattice relaxation T1, spin-spin relaxation T2, proton density), $\beta$ represents the MRI sequence parameters (e.g. b-value, echo-time, flip angle), m: $\mathfrak{R}^D \to \mathfrak{R}^+$ is a model for the imaging system and $\varepsilon$ is statistical noise from some probability distribution (e.g. Rician distribution[11]). In general, $\alpha$ are all unknown, whilst the user, within the given constraints of the MR imaging system, can select $\beta$. Quantification of tissue parameters thus relies on identification of the inverse imaging model, $m_\beta^{-1}$, such that maps of $\alpha$ can be estimated from a sequence of M images, $S=\{S_i: i=1 \ldots M\}$, each acquired with distinct scanner settings $\beta_i$:

$$\alpha'=m^{-1}(S|\beta_1 \ldots \beta_M)+\eta_\alpha$$

uncertainty in estimates resulting from image noise, $\varepsilon$, being denoted by $\eta_\alpha$.

Computed imaging is a post-processing technique that uses the estimated tissue-parameters to synthesize an image $S_c$ at some arbitrary set of sequence parameters $\beta_c$, using the assumed imaging model:

$$S_c(\alpha',\beta_c)=m(\alpha'|\beta_c)$$

Such processes can generate image contrast at values of $\beta$ not physically available to clinical scanners, and can improve signal-to-noise ratio and geometric fidelity of resultant image [8a, 8b]. This approach can be further generalised by replacing the imaging model, m, with some arbitrary function, f: $\mathfrak{R}^D \to \mathfrak{R}^+$, that has desirable properties on the output image [12]:

$$S_c(\alpha')=f(\alpha')$$

However, the present invention also incorporates the uncertainty of estimated parameters, $\eta_\alpha$, into the computed image weighting. More specifically, the estimated variance of the uncertainty, $\Sigma_\alpha'$, may be used such that computed pixels where there is a large uncertainty in the parameter estimate are heavily attenuated compared to those pixels where confidence in the estimation is high. An example of such a functional is the inverse exponential such that the computed signal intensity becomes:

$$S_c(\alpha')=f(\alpha') \cdot \exp\{-a \cdot \Sigma_\alpha'\}$$

where $a \in \mathfrak{R}^+$ is a user-controllable parameter that influences the degree of noise suppression.

Focusing particularly then on eDWI (while noting the more general applicability of the technique), signal intensity in DWI is modelled according to the following:

$$S_i(ADC, S_0, b) = S_0 \cdot \exp\{-b_i \cdot ADC\}$$

where the sequence parameters consist of a vector of M, not necessarily unique, b-values $\beta_{DWI}=(b_1, b_2, \ldots, b_M)$. By taking the logarithm of resultant images, this may be converted to a linear equation:

$$S'=\ln\{S\}=\ln S_0 - ADC \cdot \beta_{DWI}$$

To fit the inverse model a standard least-squares routine may be adopted, that is:

$$\alpha'=(\beta^T\beta)^{-1}\beta^T S' + \eta_\alpha,$$

where $$\beta = \begin{pmatrix} b_1 & \cdots & b_M \\ 1 & \cdots & 1 \end{pmatrix}^T$$

and $\alpha'=(ADC', \ln S_0')$. It may be shown that the variance in the estimate of ADC is given by:

$$\sigma^2_{ADC} = \frac{\sigma^2}{(M-2)(\overline{b^2}-\overline{b}^2)}, \overline{b}=\frac{1}{M}\sum_{i=1}^{M} b_i, \overline{b^2}=\frac{1}{M}\sum_{i=1}^{M} b_i^2$$

where $\sigma^2$ represents the sum-of-squared residuals from the linear fit, computed for each pixel. The generation of ADC maps along with variance maps is depicted in FIG. 1 which shows: (a) a diffusion weighted MR image for a given cross-section and a given b-value; (b) a plot of lnS(b) against b-value for a plurality of such images, the values for lnS(b) in the plot being taken at the pixel indicated in (a), and calculated values for ADC and standard deviation $\sigma_{ADC}$ in ADC at that pixel; (c) an ADC image for the cross-section obtained by repeating the ADC calculation for other pixels;

and (d) a $\sigma_{ADC}$ map for the cross-section obtained by repeating the $\sigma_{ADC}$ calculation for other pixels.

The above calculation of $\sigma_{ADC}^2$ requires at least three b-values (M≥3) to be acquired. If only two b-values are available, however, any of a number of methods for calculating image noise from a single image (see e.g. [13]) may be used to estimate uncertainty in the MR-sensitive, physical properties; an example of which is described in the Appendix. If there is data support, weighted-least-squares estimation can be used to improve the ADC and $\sigma_{ADC}^2$ estimation. Non-parametric estimation of $\sigma_{ADC}^2$ can also be achieved via bootstrap approaches known to the skilled person. Also, as previously indicated, such approaches can be applied outside the scope of DWI. Thus they can be applied, for example, to T1w and T2w imaging.

Figure 2:
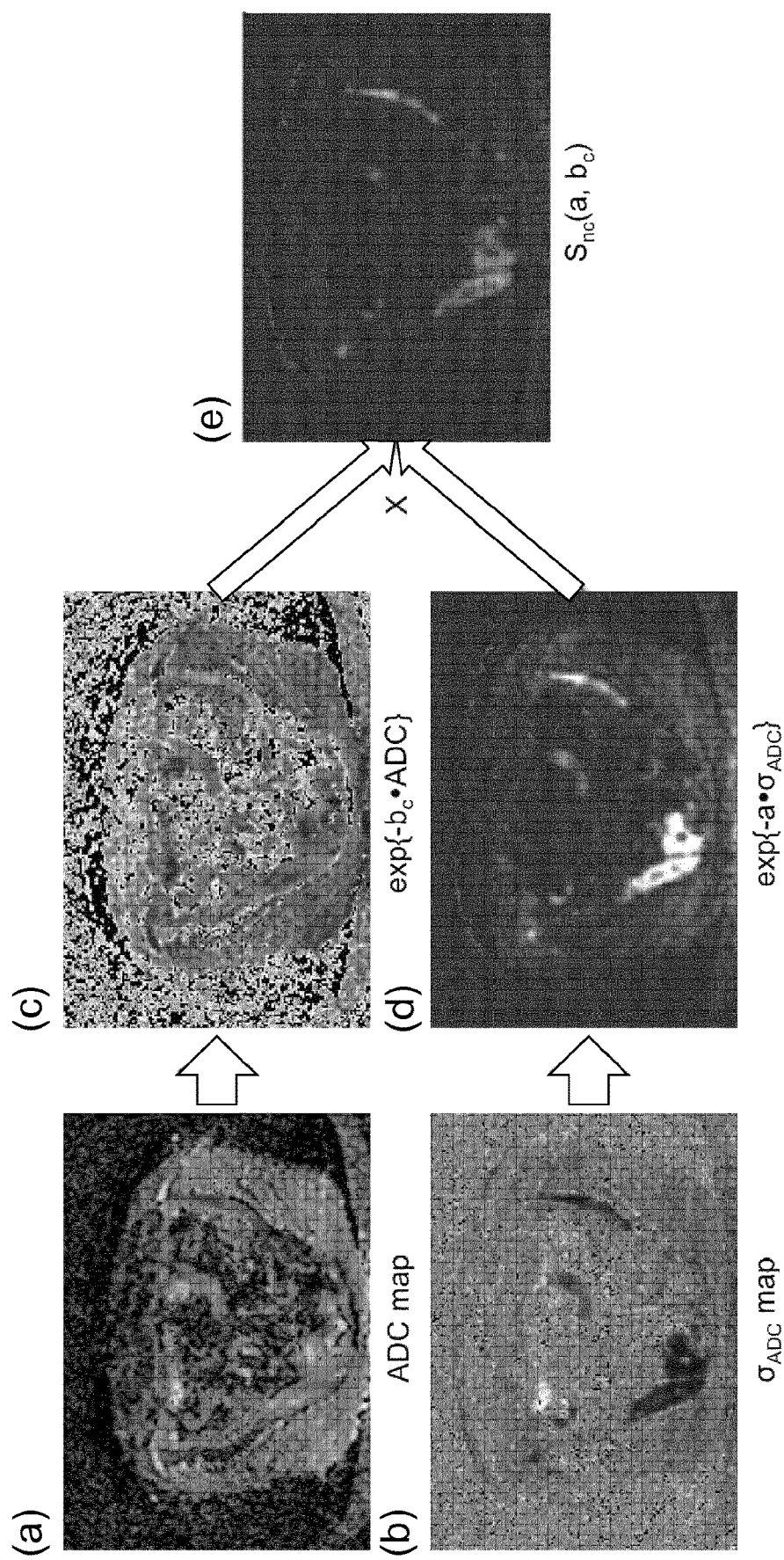
FIG. 2 shows: (a) the ADC image of FIG. 1(c); (b) the $\sigma_{ADC}$ map of FIG. 1(d); (c) a map of $\exp\{-b_c \cdot ADC\}$ derived from the ADC image; (d) a map of $\exp\{-a \cdot \sigma_{ADC}\}$ derived from the $\sigma_{ADC}$ map; and (e) the weighted MR image $S_{nc}(a, b_c) = \exp\{-b_c \cdot ADC\}\exp\{-a \cdot \sigma_{ADC}\}$.
Figure 3:
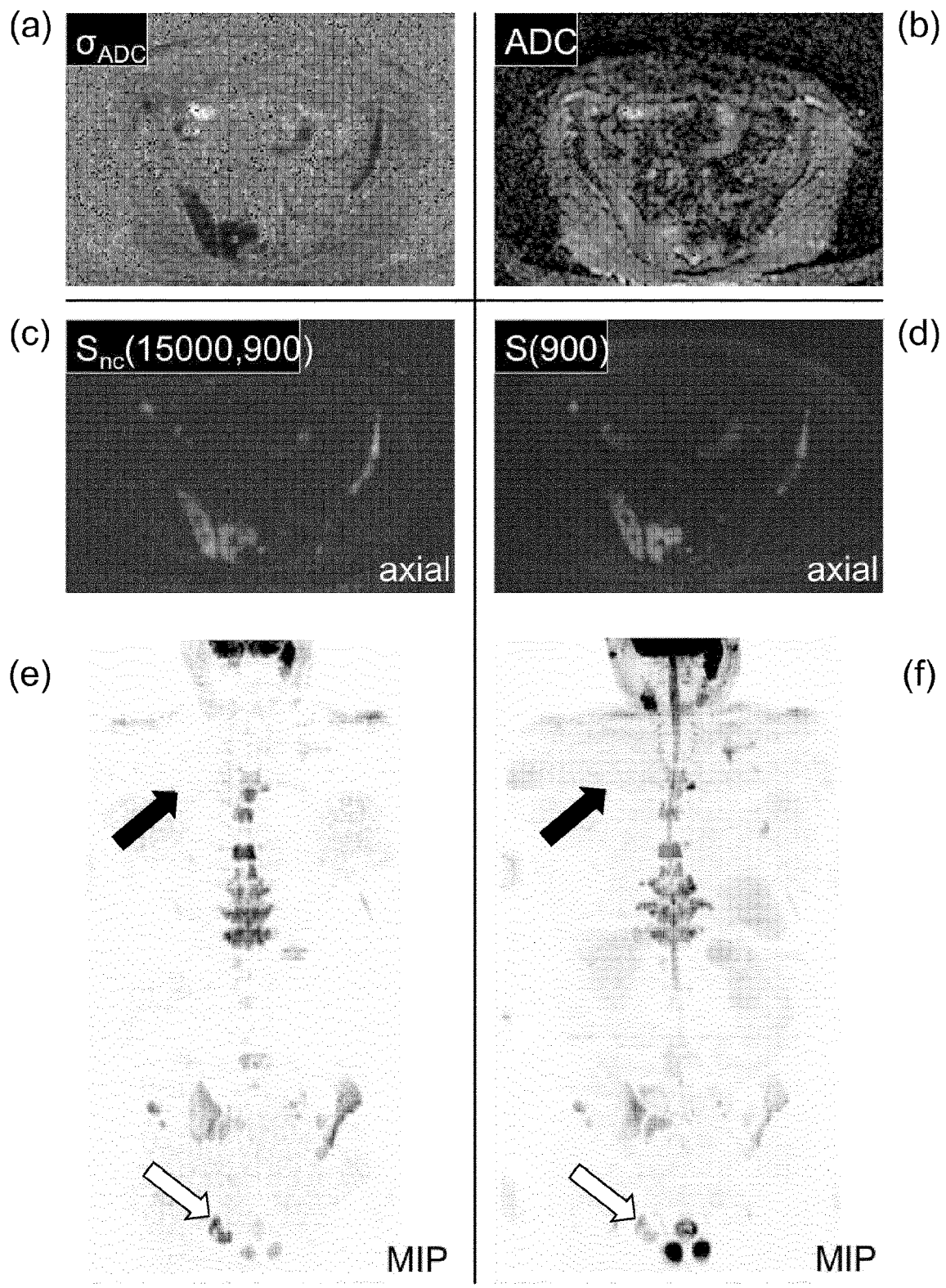
FIG. 3 shows for a first patient: (a) a $\sigma_{ADC}$ map for a reference axial cross-section; (b) the corresponding ADC image for the cross-section; (c) a corresponding noise-corrected, exponentially weighted DWI (niceDWI) image for the cross-section, the values of (a, $b_c$) used to calculate the image being indicated; (d) a corresponding high b-value image ($b=900$ s/mm$^2$) image for the cross-section; (e) a maximum intensity projection (MIP) volume obtained from the niceDWI images at $b_c$ and a-values that visually maximised the contrast between disease and background tissues; and (f) the corresponding MIP volume generated using conventionally acquired the high b-value images ($b=900$ s/mm$^2$).
Figure 4:
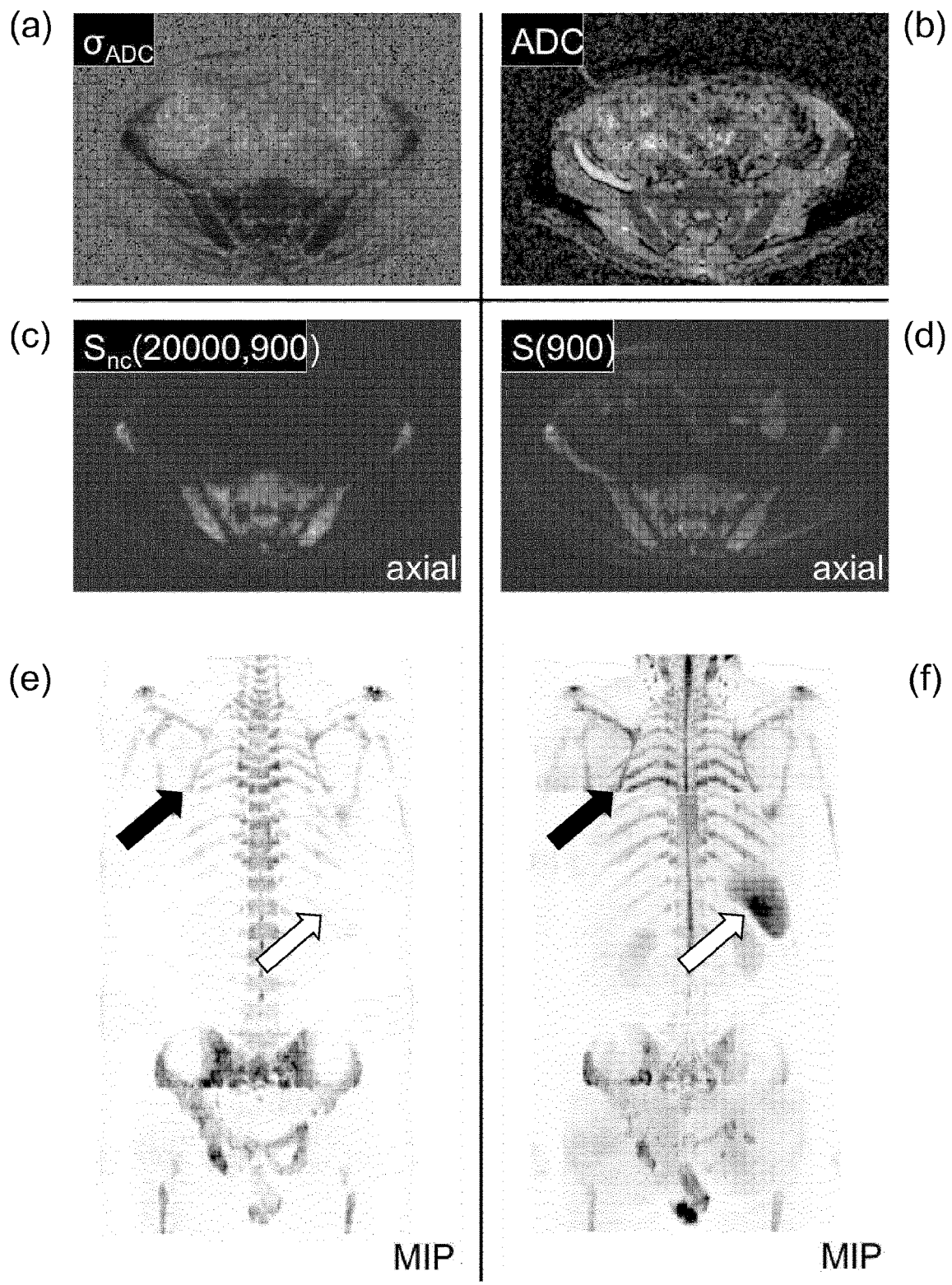
FIG. 4 shows for a second patient: (a) a $\sigma_{ADC}$ map for a reference axial cross-section; (b) the corresponding ADC image for the cross-section; (c) a corresponding niceDWI image for the cross-section, the values of (a, $b_c$) used to calculate the image being indicated; (d) a corresponding high b-value image ($b=900$ s/mm$^2$) image for the cross-section; (e) a maximum intensity projection (MIP) volume obtained from the niceDWI images at $b_c$ and a-values that visually maximised the contrast between disease and background tissues; and (f) the corresponding MIP volume generated using conventionally acquired the high b-value images ($b=900$ s/mm$^2$).
Figure 5:
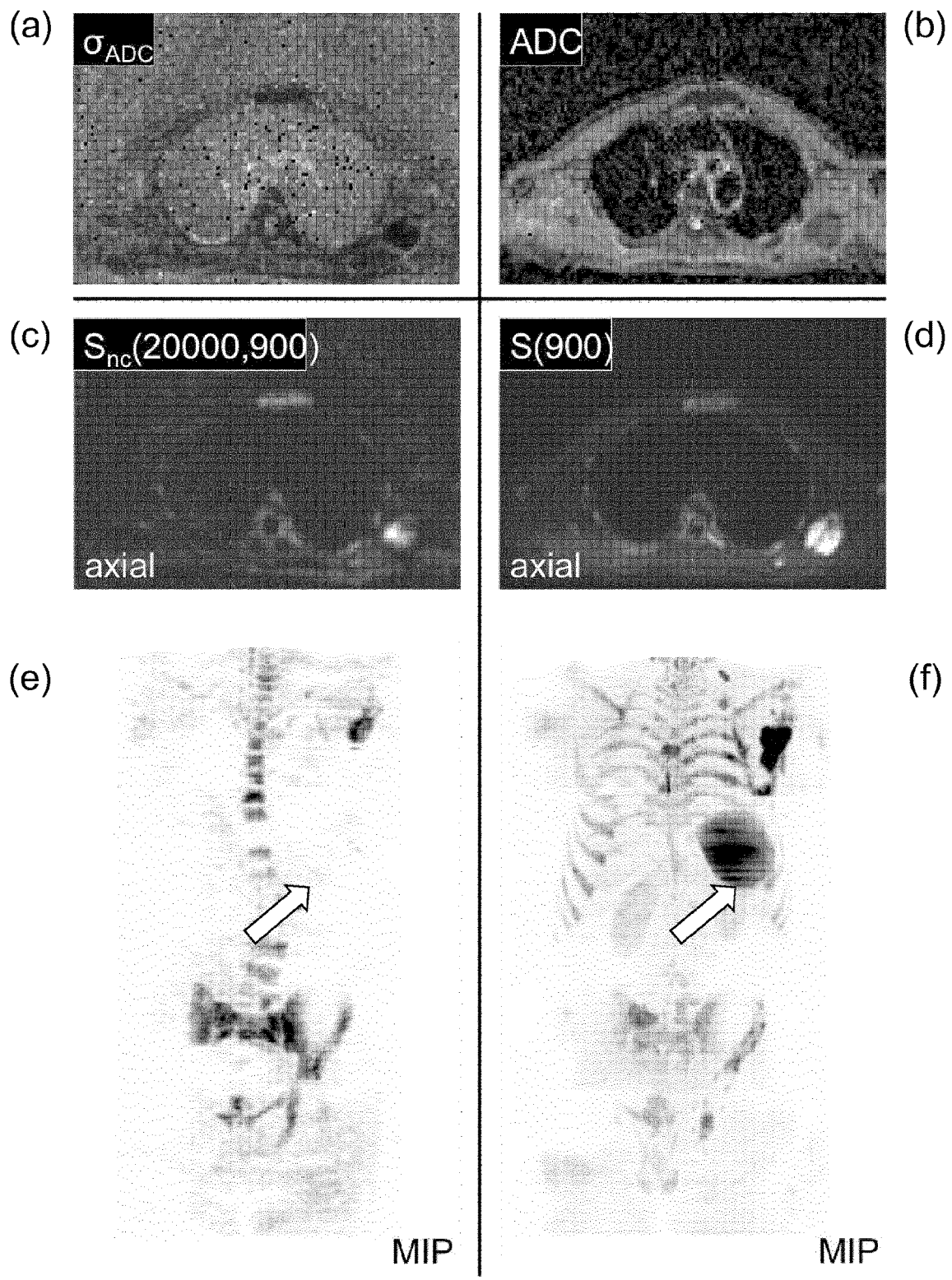
FIG. 5 shows for a third patient: (a) a $\sigma_{ADC}$ map for a reference axial cross-section; (b) the corresponding ADC image for the cross-section; (c) a corresponding niceDWI image for the cross-section, the values of (a, $b_c$) used to calculate the image being indicated; (d) a corresponding high b-value image ($b=900$ s/mm$^2$) image for the cross-section; (e) a maximum intensity projection (MIP) volume obtained from the niceDWI images at $b_c$ and a-values that visually maximised the contrast between disease and background tissues; and (f) the corresponding MIP volume generated using conventionally acquired the high b-value images ($b=900$ s/mm$^2$).

The contrast in noise-corrected, exponentially weighted DWI (niceDWI) can be defined as:

$$S_{nc}(a,b_c) = \exp\{-b_c \cdot ADC\} \cdot \exp\{-a \cdot \sigma_{ADC}\}$$

where $b_c$ and a are user-definable parameters that control the amount of diffusion and noise weighting in the synthesized image respectively. The use of inverse exponential functions has desirable properties on the final image. In particular, high $b_c$ values result in images having high signal intensity in areas where the ADC is low, and high a values result in images having high signal intensity in areas where there is a high degree of confidence in the fitted ADC estimates. This approach is illustrated in FIG. 2 which shows: (a) the ADC image of FIG. 1(c); (b) the $\sigma_{ADC}$ map of FIG. 1(d); (c) a map of $\exp\{-b_c \cdot ADC\}$ derived from the ADC image; (d) a map of $\exp\{-a \cdot \sigma_{ADC}\}$ derived from the $\sigma_{ADC}$ map; and (e) the weighted MR image $S_{nc}(a, b_c) = \exp\{-b_c \cdot ADC\}\exp\{-a \cdot \sigma_{ADC}\}$.

Results

Whole-body DW-images were acquired on a 1.5 T MRI scanner (MAGNETOM Aera, Siemens AG, Healthcare Sector, Erlangen, Germany) with the following parameters: b-values=50/900 or 50/600/900 s/mm², orthogonal diffusion encoding directions, STIR fat suppression (TI=180 ms), Slice Thickness=5 mm, GRAPPA image acquisition (reduction factor=2). Images were acquired on a moving table in 4 stations comprising of 40 slices each to cover the entire torso. Images at each station were acquired 3 times, each with 1 signal average (NeX), and data from the individual diffusion encoding directions were exported individually. The final data set therefore consisted of 9 images acquired at each slice location at each b-value.

Whole-body MR-imaging was performed in this way for three patients with metastatic bone disease from prostate cancer.

For each patient the following images (a) to (f) were generated:
 (a) a $\sigma_{ADC}$ map for a reference axial cross-section;
 (b) the corresponding ADC image for the cross-section;
 (c) a corresponding niceDWI image for the cross-section, the values of (a, $b_c$) used to calculate the image being indicated;
 (d) a corresponding high b-value image (b=900 s/mm²) image for the cross-section;
 (e) a maximum intensity projection (MIP) volume obtained from the niceDWI images at be and a-values that visually maximised the contrast between disease and background tissues; and
 (f) the corresponding MIP volume generated using conventionally acquired the high b-value images (b=900 s/mm²).

FIG. 3(a) to (f) shows these images for the first patient. The niceDWI is able to remove spurious discontinuities in signal intensity present at the inter-station interface (upper arrows in (e) and (f)) and can improve lesion-to-background contrast (lower arrows in (e) and (f)).

FIG. 4(a) to (f) shows these images for the second patient. Again the niceDWI is able to remove spurious discontinuities in signal intensity present at the inter-station interface (upper arrows in (e) and (f)). It can also remove the presence of normal tissue such as the kidneys and spleen (lower arrows in (e) and (f)).

FIG. 5(a) to (f) shows these images for the third patient. Again the niceDWI can remove the presence of normal tissue such as the kidneys and spleen (arrows in (e) and (f)).

APPENDIX—ESTIMATION OF ADC UNCERTAINTY WITHOUT MULTIPLE ACQUISITIONS

1. Theory

As discussed above, ADC calculation may be achieved through linear least-squares approximation from diffusion-weighted images, $S_i$, acquired at N different b-values:

$$\widehat{ADC} = \frac{\sum_{i=1}^{N} b_i Y_i - \frac{1}{N}\sum_{i=1}^{N} b_i \sum_{i=1}^{N} Y_i}{\sum_{i=1}^{N} b_i^2 - \frac{1}{N}\left(\sum_{i=1}^{N} b_i\right)^2} \quad (1)$$

$$= \beta\left(\sum_{i=1}^{N} b_i Y_i - \frac{1}{N}\sum_{i=1}^{N} b_i \sum_{i=1}^{N} Y_i\right) \quad Y_i = \ln S_i$$

By error propagation it is thus possible to estimate the variance in ADC estimates as:

$$\hat{\sigma}_{ADC}^2 = \beta^2 \sum_{i=1}^{N} \sigma_{Y_i}^2 (b_i - \bar{b})^2 \quad (2)$$

where $$\bar{b} = \frac{1}{N}\sum_{i=1}^{N} b_i.$$

From equation (2) it is clear that estimates of $\sigma_{Y_i}^2$, the variance of log-signal at each b-value, are required. One method would be to perform $M_i$ repeat measurements of $Y_i$ at each b-value leading to evaluation by:

$$\sigma_{Y_i}^2 = \frac{1}{M_i - 1}\sum_{j=1}^{M_i} (Y_{ij} - \bar{Y}_i)^2 \quad (3)$$

It is worthy of note that we may not assume constant $\sigma_i^2$ as such data are heteroskedastic. However, if direct measurement is not possible, we may use the following approximation. Assuming that image noise in the non-log domain is approximately Gauss distributed (i.e. approximate $S_i \sim \mathcal{N}(\mu, \sigma)_i$) then we have by error propagation [14]:

$$\sigma_{Y_i} \approx \frac{\sigma}{S_i}. \qquad (4)$$

such that:

$$\hat{\sigma}_{ADC}^2 \approx \beta^2 \sigma^2 \sum_{i=1}^{N}\left(\frac{b_i - \bar{b}}{S_i}\right)^2 \propto \sum_{i=1}^{N}\left(\frac{b_i - \bar{b}}{S_i}\right)^2 \qquad (5)$$

It is clear that contrast in voxel-wise maps of $\sigma_{ADC}^2$ generated via equation (4) is dependent only on the choice of b-values, b and the measured signal value at each b-value, $S_i$. In order determine absolute measurements an estimate of $\sigma^2$ is required as discussed below.

2. Estimation of $\sigma^2$

A number of options are available for estimating the noise variance of magnitude DW-images (e.g. via wavelet decomposition or high-pass filtering). Here we investigate the possibility of using Gaussian Mixture Modelling (GMM) of the log-space data from the lowest b-value image to segment the background noise and thus approximate $\sigma^2$ from this region in the original dataset. We consider the data in low b-value log-image, $Y_1$, to consist of P Gaussian distributions:

$$Y_1 \sim \sum_{p=1}^{P} w_p \mathcal{N}(\mu_p, \sigma_p), \sum_{p=1}^{P} w_p = 1$$

Following GMM we make the assumption that the Gaussian component with the lowest mean represents the background noise class, i.e.

$$p^\dagger = \underset{p}{\mathrm{argmin}}\{\mu_1, \mu_2, \ldots, \mu_P\}.$$

Figure 6:
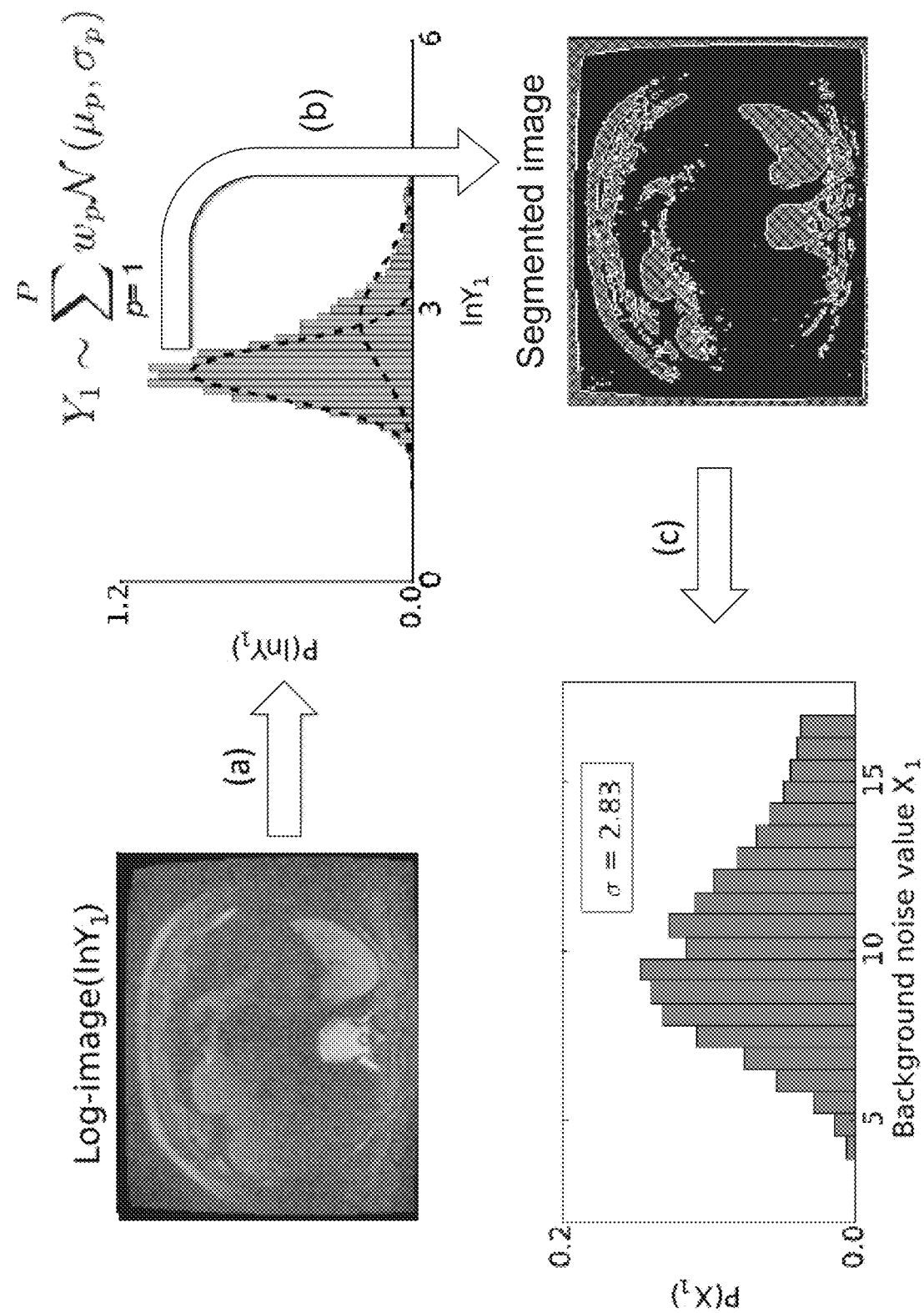
FIG. 6 shows an example of background noise variance calculation. Data from the logarithm of the lowest b-value image is modelled as a mixture of Gaussians (a). The Gaussian component with lowest mean is used to classify regions of background (outside hatched regions) on the magnitude image of lowest b-value (b). Data within the background region is used to estimate a for the image (c).

Classification of background pixels is then straightforward via conventional maximum posterior estimation, from which the noise variance may be calculated (illustrated in FIG. 6).

3. Examples

Figure 7:
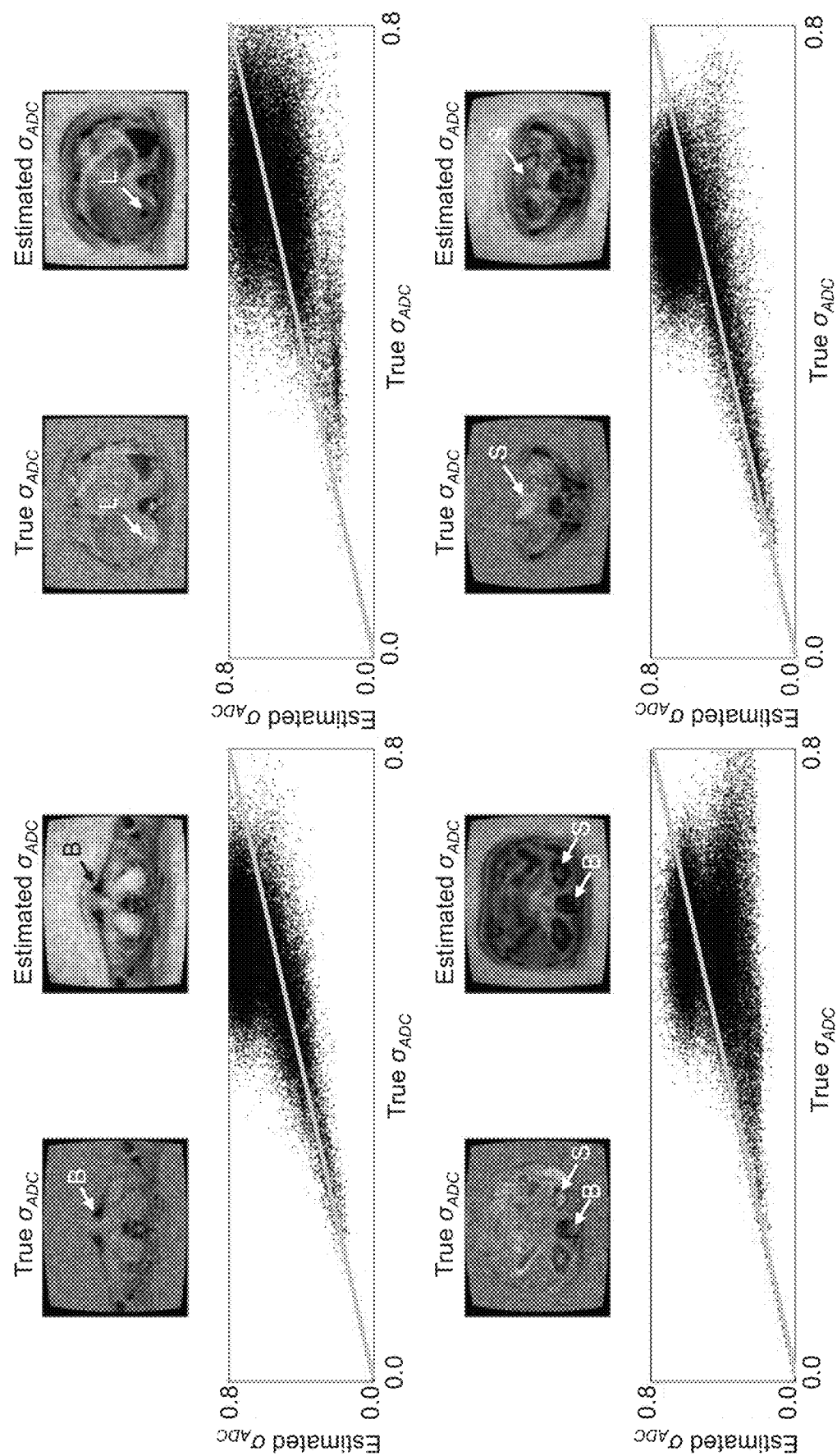
FIG. 7 shows four examples of calculation of $\sigma_{ADC}$ via direct calculation of image noise variance through multiple acquisitions (labelled "True", left image in each case) and via estimation from mean images (labelled "Estimated", right image in each case). Scatter plots reveal pixel-wise correlations between true and estimated $\sigma_{ADC}$ calculations, where the dashed line represents the line of equality. In general there is good concordance between both techniques, especially in those regions not affected by motion such as bone (arrows B). Those areas affected by motion can lead to differences in calculation, especially in the bowel, kidneys and spleen. In these regions the estimated value tend to underestimate the true value (arrows S). The insensitivity to motion can be advantageous: In the top-right example true calculation reveals a high value for $\sigma_{ADC}$ for a liver lesion whereas the estimated value is much lower improving contrast with surrounding healthy liver (arrows L).

Axial DW-images were acquired from a patient with the following b-values: {50×9; 600×9; 900×9}. Gold-standard ("true") calculations of $\sigma_{ADC}$ were calculated using equations (2) and (3), whilst estimated values were calculated using equations (4) and (5) using a second image dataset comprising of mean images at each different b-value. Examples of both estimation methods are demonstrated for four axial locations in a single patient in FIG. 7. It is revealed that there is good general correspondence between true and estimated values of $\sigma_{ADC}$. There is slight underestimation when using equation (4) within tissues and slight overestimation of background noise. Good estimation is found especially in static locations such the bone, whereas regions affected by motion (e.g. kidneys, bowel and spleen) are generally underestimated. This underestimation can be advantageous: In the liver, there is very little contrast between metastases and healthy tissue when using the gold-standard technique. The insensitivity to motion of equation (4) improves the contrast of the lesion.

Figure 8:
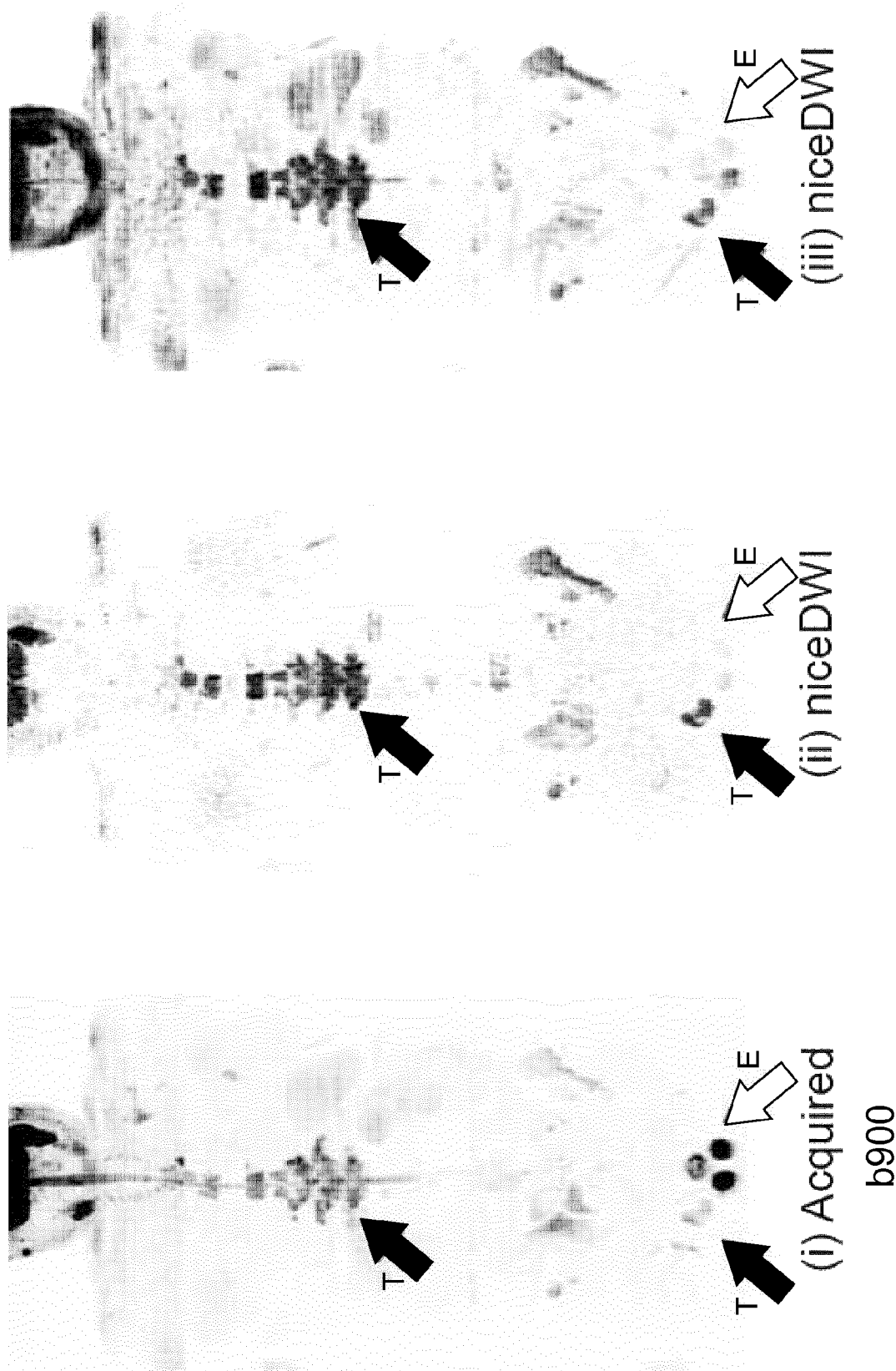
FIG. 8 shows niceDWI images acquired with (i) conventional high b-value images, (ii) niceDWI where repeat b-value acquisitions are available, and (iii) estimates of $\sigma_{ADC}$ where repeat b-value acquisitions are not possible. Approach (iii) can provide similar contrast between healthy tissues such as the testes (arrows E) and tumour (arrows T)

Demonstrated in FIG. 8 is a comparison of maximum intensity projections (MIPs) for: (i) conventionally acquired high b-value (b900) images, (ii) niceDWI images generated using $\sigma_{ADC}$ calculated from nine repeat acquisitions at each b-value, and (iii) niceDWI images generated using $\sigma_{ADC}$ calculated from the methodology outlined above where repeat acquisitions at each b-value are not possible. This shows that where repeat acquisitions are not possible at distinct b-values, approaches such as the one outlined above can generate similar image contrast between tumour (black arrows) and healthy tissues such as the testes (white arrow) as compared to approaches where acquisitions at different b-values are possible.

REFERENCES

All the references below are hereby incorporated by reference.
1. Koh D M, Blackledge M, Padhani A R, Takahara T, Kwee T C, et al. (2012) Whole-body diffusion-weighted MRI: tips, tricks, and pitfalls. AJR Am J Roentgenol 199: 252-262.
2. Eiber M, Holzapfel K, Ganter C, Epple K, Metz S, et al. (2011) Whole-body MRI including diffusion-weighted imaging (DWI) for patients with recurring prostate cancer: technical feasibility and assessment of lesion conspicuity in DWI. J Magn Reson Imaging 33: 1160-1170.
3. Padhani A R, Koh D M, Collins D J (2011) Whole-body diffusion-weighted MR imaging in cancer: current status and research directions. Radiology 261: 700-718.
4. van Ufford H M, Kwee T C, Beek F J, van Leeuwen M S, Takahara T, et al. (2011) Newly diagnosed lymphoma: initial results with whole-body T1-weighted, STIR, and diffusion-weighted MRI compared with 18F-FDG PET/CT. AJR Am J Roentgenol 196: 662-669.
5. Giles S L, Messiou C, Collins D J, Morgan V A, Simpkin C J, et al. (2014) Whole-body diffusion-weighted MR imaging for assessment of treatment response in myeloma. Radiology 271: 785-794.
6. Koh D M, Collins D J (2007) Diffusion-weighted MRI in the body: applications and challenges in oncology. AJR Am J Roentgenol 188: 1622-1635.
7. Padhani A R, Makris A, Gall P, Collins D J, Tunariu N, et al. (2014) Therapy monitoring of skeletal metastases with whole-body diffusion MRI. J Magn Reson Imaging 39: 1049-1078.
8a. Blackledge M D, Leach M O, Collins D J, Koh D M (2011) Computed diffusion-weighted MR imaging may improve tumor detection. Radiology 261: 573-581.
8b. WO2010/116124.
9. Blackledge M D, Collins D J, Tunariu N, Orton M R, Padhani A R, et al. (2014) Assessment of treatment response by total tumor volume and global apparent diffusion coefficient using diffusion-weighted MRI in patients with metastatic bone disease: a feasibility study. PLoS One 9: e91779.
10. Provenzale J M, Engelter S T, Petrella J R, Smith J S, MacFall JR (1999) Use of MR exponential diffusion-weighted images to eradicate T2 "shine-through" effect. AJR Am J Roentgenol 172: 537-539.
11. Gudbjartsson H, Patz S (1995) The Rician distribution of noisy MRI data. Magn Reson Med 34: 910-914.

12. Gatidis S, Schmidt H, Martirosian P, Nikolaou K, Schwenzer N F (2015) Apparent diffusion coefficient-dependent voxelwise computed diffusion-weighted imaging: An approach for improving SNR and reducing T shine-through effects. J Magn Reson Imaging.
13. Coupe P, Manjón, JV, Gedamu E, Arnold D, Robles M, Collins L (2010) Robust Rician noise estimation for MR images. Med. Image Analysis 14(4): 483-493.
14. Jelle Veraart, Jan Sijbers, Stefan Sunaert, Alexander Leemans, and Ben Jeurissen. Weighted linear least squares estimation of di_usion mri parameters: strengths, limitations, and pitfalls. Neuroimage, 81:335-46, November 2013.

The invention claimed is:

1. A method of producing a magnetic resonance (MR) image of a region of interest, the method including the steps of:
mapping values of an MR-sensitive, physical property at positions over a region of interest, the mapped values being acquired from initial MR images of the region;
determining a corresponding map of estimated uncertainties in the values of the MR-sensitive, physical property at the positions over the region; and
calculating a weighted MR image of the region, the weighted MR image mapping values of a function which combines, at each position of the initial image, the respective value of the MR-sensitive, physical property and the respective estimated uncertainty, the function applying a higher weighting to positions with relatively low estimated uncertainties than to positions with relatively high estimated uncertainties,
wherein the estimated uncertainties are variances of the values of the MR-sensitive, physical property.

2. The method according to claim 1, wherein the function applies an inverse exponential weighting to the estimated uncertainties.

3. The method according to claim 1, wherein the estimated uncertainties are determined from an inverse model of the values of the MR-sensitive, physical property over the region.

4. The method according to claim 3, wherein, in the determination, the inverse model is fitted to the values of the MR-sensitive, physical property using a least-squares procedure.

5. The method according to claim 1, wherein the MR-sensitive, physical property is apparent diffusion coefficient, T1, T2, or proton density.

6. The method according to claim 1, wherein the MR-sensitive, physical property is apparent diffusion coefficient, and the function applies a higher weighting to positions with relatively low apparent diffusion coefficient than to positions with relatively high apparent diffusion coefficient.

7. The method according to claim 6, wherein the function applies an inverse exponential weighting to the apparent diffusion coefficient.

8. The method according to claim 6, wherein initial MR image mapping values of apparent diffusion coefficient at positions over the region is acquired by obtaining plural diffusion weighted images over the region at different b-values, and deriving the initial MR image therefrom.

9. A method of displaying 3D MR image data, the method including the steps of:
performing the method of claim 1 for each of a plurality of regions of interest which are respective parallel slices through a volume of interest, and thereby obtaining for each slice a corresponding weighted MR image; and
displaying the weighted MR images as a projected volumetric image.

10. A computer system operatively configured to perform the method of claim 1.

11. A magnetic resonance imaging apparatus having the computer system of claim 10.

12. A non-transitory computer-readable medium comprising a computer program for performing the method of claim 1.

13. A computer program product comprising the non-transitory computer-readable medium carrying the program of claim 12.

* * * * *